(12) United States Patent
Tsuzaki et al.

(10) Patent No.: US 6,391,676 B1
(45) Date of Patent: May 21, 2002

(54) THERMOELECTRIC MODULE AND A METHOD OF FABRICATING THE SAME

(75) Inventors: Michimasa Tsuzaki, Neyagawa; Nobuteru Maekawa, Katano; Narimasa Iwamoto, Nabari; Junji Imai, Amagasaki; Hiroaki Okada, Nara; Teruaki Komatsu, Hikone; Shinya Murase, Hikone; Hiroyuki Inoue, Hikone; Masayuki Sagawa, Hikone; Yuri Sakai, Monbetsu, all of (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 09/200,972

(22) Filed: Nov. 30, 1998

(30) Foreign Application Priority Data

| Dec. 5, 1997 | (JP) | ............................................. 9-336180 |
| May 22, 1998 | (JP) | ......................................... 10-141733 |
| Sep. 14, 1998 | (JP) | ......................................... 10-260568 |

(51) Int. Cl.$^7$ .............................................. H01L 21/00
(52) U.S. Cl. ......................................... 438/54; 438/48
(58) Field of Search ............................... 438/55, 48, 54

(56) References Cited

U.S. PATENT DOCUMENTS

| 2,844,638 A |   | 7/1958  | Lindenblad ................. 136/203 |
| 3,209,433 A |   | 10/1965 | Meyer et al. |
| 3,237,281 A |   | 3/1966  | Antonson .................... 136/201 |
| 3,615,870 A | * | 10/1971 | Crouthamel ................. 136/204 |
| 4,687,879 A |   | 8/1987  | Hendricks .................... 136/212 |
| 4,938,244 A |   | 7/1990  | Kumada et al. ............. 136/212 |
| 5,362,983 A | * | 11/1994 | Yamamura et al. ......... 257/414 |
| 5,434,744 A |   | 7/1995  | Fritz et al. ................... 361/704 |

(List continued on next page.)

FOREIGN PATENT DOCUMENTS

| DE | 33 14 160 A1  |   | 11/1983 |
| DE | 196 46 905 A1 |   | 5/1997  |
| DE | 196 46 915 A1 |   | 5/1997  |
| EP | 0 506 093 A1  |   | 9/1992  |
| EP | 0 687 020 A1  |   | 12/1995 |
| EP | 0 930 658 A1  |   | 7/1999  |
| JP | 8-64875       |   | 3/1996  |
| JP | 2000286468 A  | * | 10/2000 |
| WO | 97/45882      |   | 12/1997 |

*Primary Examiner*—John F. Niebling
*Assistant Examiner*—Christopher Lattin
(74) *Attorney, Agent, or Firm*—Rader, Fishman & Grauer, PLLC

(57) ABSTRACT

A thermoelectric module is capable of successfully reducing the heat stress for increased reliability. The module includes a plurality of thermoelectric chips of P-type and N-type arranged in a matrix between sets of first and second contacts to form a series electrical circuit. The chips are arranged to give at least three chip arrays each having a limited number of the chips. A first carrier is provided on one side of the chips to carry the first contacts and to include first bridges each integrally joining two adjacent first contacts to define first discrete couples for electrical connection of the chips in each chip array. The first carrier further includes at least two inter-array bridges which are solely responsible for electrical interconnection between the adjacent chip arrays. On the opposite side of the chips, there are formed a plurality of second bridges each integrally joining the two adjacent second contacts to give second discrete couples for electrical connection of the two adjacent chips in each of the chip arrays. Thus, the inter-array bridges are formed only on one side of the chips for interconnection of the first contacts between the adjacent chip arrays. Therefore, the heat stress applied to the end of the chip array where the two adjacent chip arrays are interconnected can be well relieved on the side of the second contacts in which the second discrete couples are kept totally isolated from each other.

11 Claims, 13 Drawing Sheets

U.S. PATENT DOCUMENTS 5,441,576 A * 8/1995 Bierschenk et al. ........ 136/203
5,522,225 A   6/1996 Eskandari ..................... 62/3.7
5,817,188 A * 10/1998 Yahatz et al. ............... 136/237
5,824,561 A * 10/1998 Kishi et al. ................... 438/55
5,950,067 A *  9/1999 Maegawa et al. ............. 438/22
6,028,263 A *  2/2000 Kobayashi et al. ......... 136/201

* cited by examiner

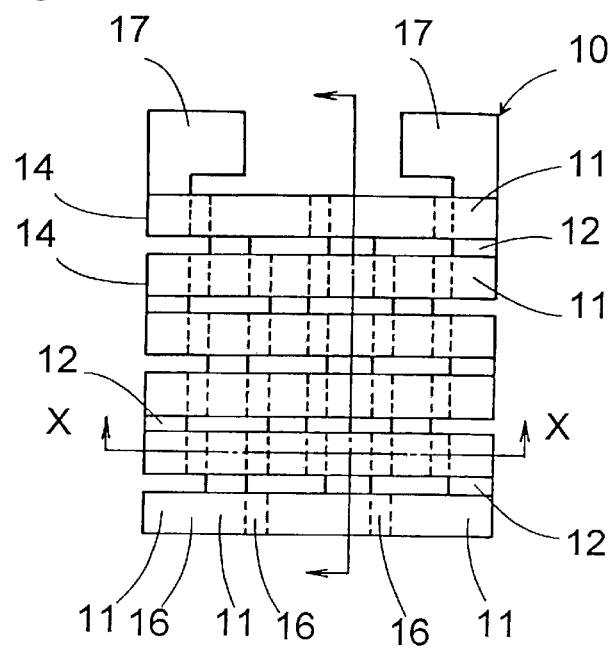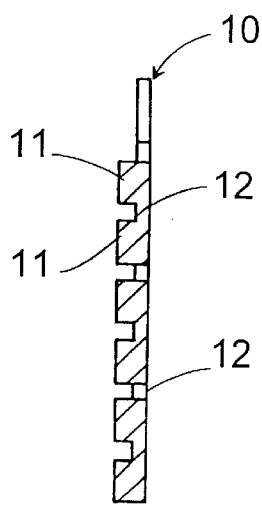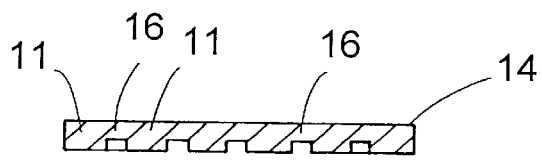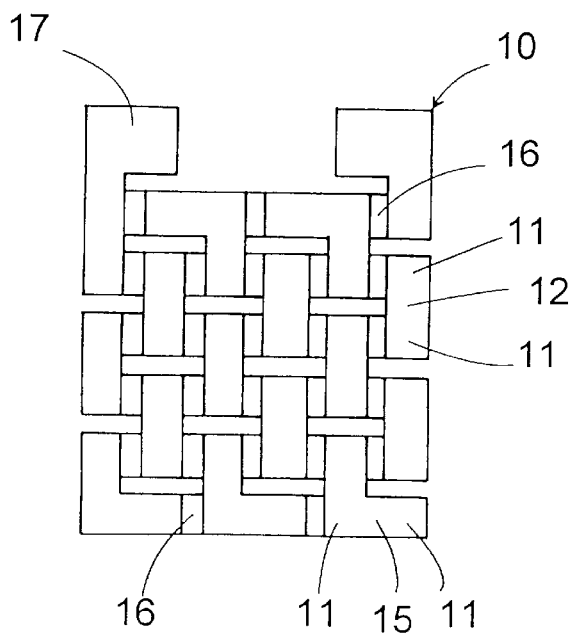

FIG.27
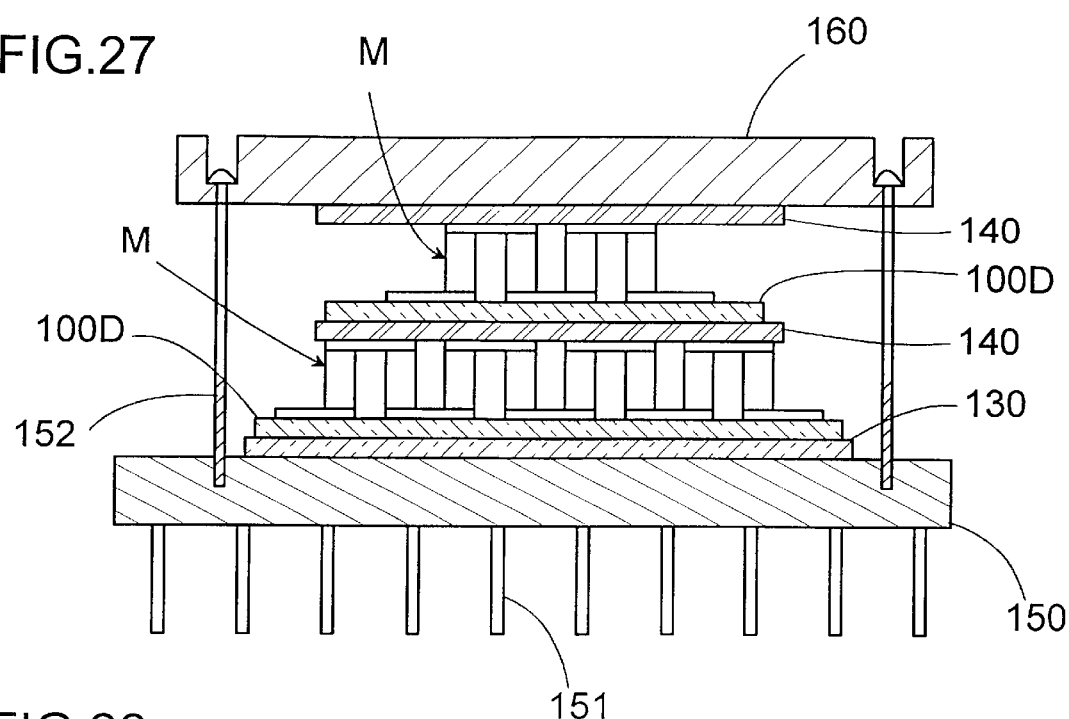
FIG.28
FIG.29
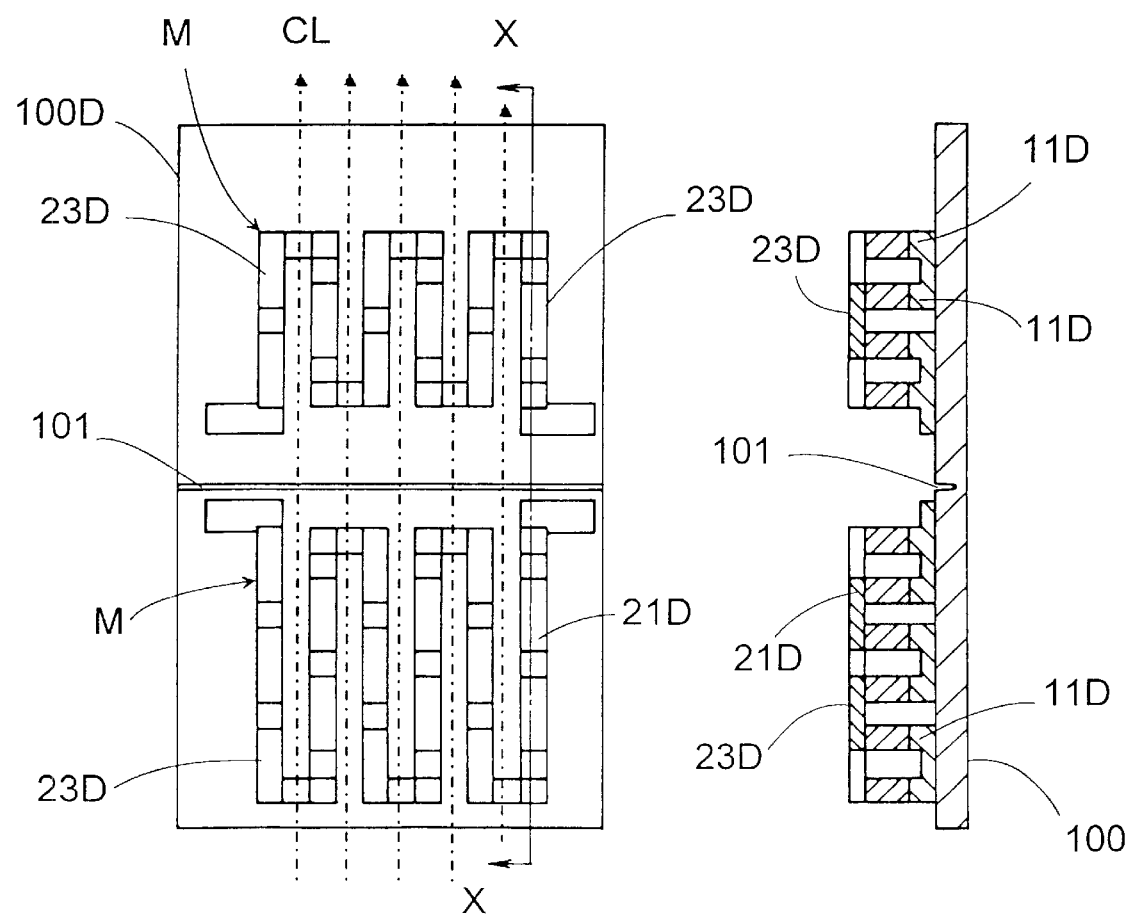

X

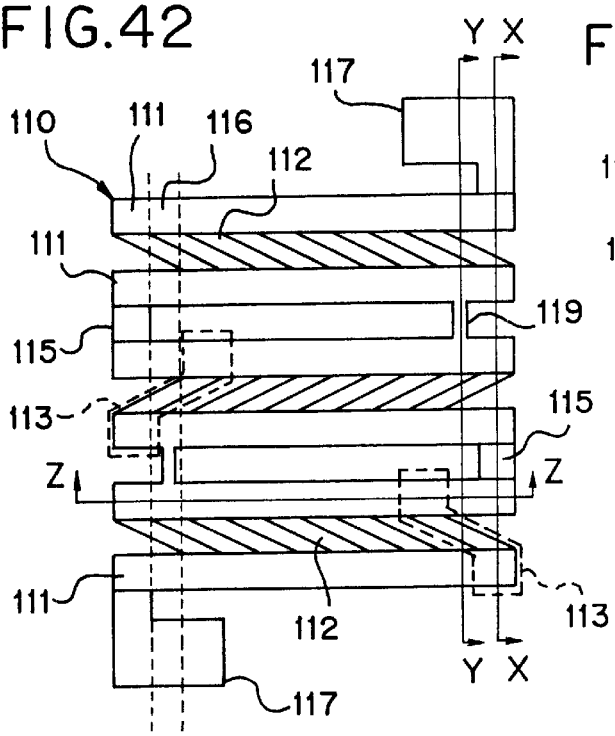
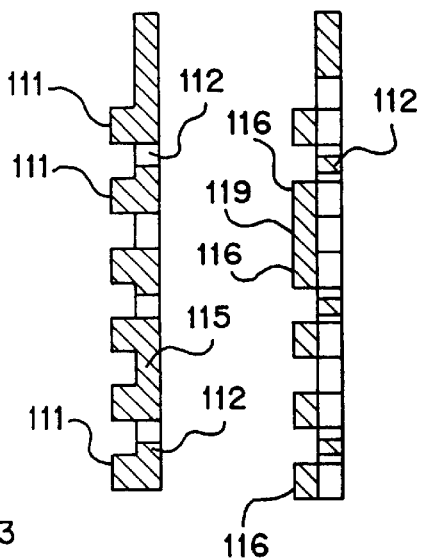
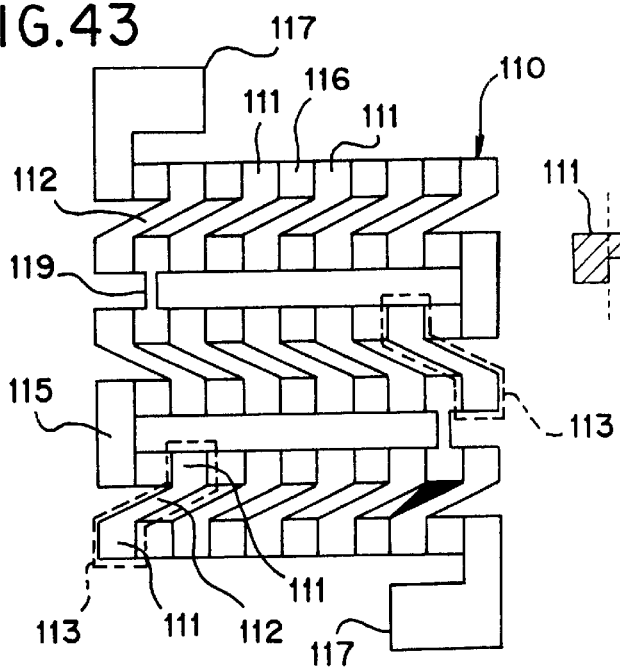

THERMOELECTRIC MODULE AND A METHOD OF FABRICATING THE SAME

BACKGROUND ART

1. Field of the Invention

The present invention relates to a thermoelectric module and a method of fabricating the thermoelectric module having a matrix of series connected thermoelectric chips for use in a heat-exchange system.

2. Description of the Prior Art

WO 97/45882 discloses a prior thermoelectric module having a matrix of thermoelectric chips which are arranged between a set of first contacts and a set of second contacts to form a series electric circuit. The circuit is composed of a plurality of linear arrays each having a limited number of the chips of P-type and N-type arranged alternately along a column of the matrix and are bonded on one face of the chips to the individual first contacts and bonded on the opposite face to the individual second contacts. The two adjacent first contacts in each linear array are connected to form first discrete couples, while the two adjacent second contacts are likewise connected to form second discrete couples. Thus, the chips in the individual linear arrays are connected in series to form sub-circuits. The sub-circuits are electrically interconnected by means of first and second inter-array bridges which are formed respectively on the sides of the first and second contacts to extend across the two first and second contacts of the adjacent linear arrays, respectively. Thus, the chip at one end of the linear array is restricted on its one side by the first or second couples in the single array and also restricted on the opposite side by the second or first inter-array bridges extending across the two adjacent arrays.

Generally, the thermoelectric module is utilized with the set of the first contacts rigidly mounted on a supporting structure and with the set of the second contacts in rather soft contact with a heating or cooling member. Therefore, heat stress developed at the individual chips during the use is better to be relieved on the side of the second contacts rather than on the side of the first contacts rigidly mounted on the supporting structure. Nevertheless, the presence of the second inter-array bridge utilized in the above prior art becomes a certain hindrance to relieving the heat stress on the side of the second contacts. That is, the adjacent arrays or sub-circuits of the chips are restricted to each other by the second inter-array bridge so that heat stress is difficult to be relieved on the side of the second contacts, thereby sometimes resulting in undesired fracture or crack in the chip at the end of the array which is restricted on the opposite sides thereof in the two different directions one along the individual array and the other crossing therewith.

SUMMARY OF THE INVENTION

The present invention has been accomplished in view of the above problem and has a primary object of providing an improved thermoelectric module which is capable of successfully reducing the heat stress for increased reliability. The thermoelectric module in accordance with the present invention includes a plurality of thermoelectric chips of P-type and N-type arranged in a matrix between a set of first contacts and a set of second contacts to form a series connected electrical circuit which is adapted to flow an electric current therethrough for heating one side of the first and second contacts while cooling the other side of the first and second contacts due to the Peltier effect at the chips. The chips are arranged to give at least three chip arrays each having a limited number of the chips. A first carrier is provided on one side of the chips to carry the set of the first contacts and to include first bridges each integrally joining two adjacent first contacts to define first discrete couples for electrical connection of the chips in each chip array. The first carrier further includes at least two inter-array bridges which are solely responsible for electrical interconnection between the adjacent chip arrays. The first carrier is fixedly mounted on a rigid substrate so as to restrain the first discrete couples on the substrate. On the opposite side of the chips, there are formed a plurality of second bridges each integrally joining the two adjacent second contacts to give second discrete couples for electrical connection of the two adjacent chips in each of the chip arrays. With this structural arrangement, the inter-array bridges are formed only on one side of the chips for interconnection of the first contacts between the adjacent chip arrays, while the second contacts are distributed on the other side of the chips as second discrete couples. Thus, the heat stress applied to the end of the chip array where the two adjacent chip arrays are interconnected can be well relieved on the side of the second contacts in which the second discrete couples are kept totally isolated from each other.

Accordingly, it is a primary object of the present invention to provide a thermoelectric module which is capable of relieving the heat stress developed in the chips during the use to give a fracture-free rugged structure.

In one preferred embodiment, each chip array is defined by the chips, the first contacts, and the second contacts all arranged along each column of the matrix. The first bridges are first vertical bridges each integrally joining the two adjacent first contacts in each column to give the first discrete couples. The inter-array bridges are formed to join the two adjacent first contacts in the outermost rows of the matrix to form horizontal couples for electrical interconnection between the adjacent chip arrays. The second bridges are in the form of second vertical bridges each integrally joining the two adjacent second contacts in each column of the matrix to give the second discrete couples so that the second discrete couples arranged along one column of the matrix are uniformly staggered with respect to the second discrete couples arrange along the adjacent column of the matrix.

In another preferred embodiment of the present invention, each chip array is defined by the chips arranged in a pair of the two adjacent rows of the matrix, the first contacts in the corresponding two adjacent rows of matrix, and the second contacts in the corresponding two adjacent rows of matrix. The first bridges are in the form of first oblique bridges each integrally joining a pair of two obliquely opposed first contacts, one in the one row and the other in the adjacent row to give the first discrete couples. The inter-array bridges are provided to join a pair of two vertically opposed first contacts, one in the row of the chip array and the other in the row of the adjacent chip array for electrical interconnection between the adjacent chip arrays. The second bridges are in the form of second vertical bridges each integrally joining the two adjacent second contacts in each column of the matrix to give the second discrete couples which are aligned along the columns as well as along the rows of the matrix. With this arrangement, the chips of the P-type and N-type can be arranged alternately along the entire length of the series circuit over the plural chip arrays without leaving no duplicate couples of the same type at the connection between the chip arrays, thereby providing a tight distribution of the chip within a limited space for improved heat-transfer efficiency.

The present invention also provides an improved method of fabricating the thermoelectric module. The method utilizes a plurality of thermoelectric bars of P-type and N-type to be subsequently separated into the thermoelectric chips, a first carrier carrying the set of first contacts, and a second conductive plate carrying the set of the second contacts. The first carrier includes the first bridges forming the first discrete couples, and includes at least two inter-array bridges which are solely responsible for electrical interconnection between the adjacent chip arrays. The second conductive plate includes the second bridges defining the second discrete couples, and includes the second beams which integrally connect the second discrete couples in order that all of the second discrete couples are retained to the second conductive plate prior to being cut. Firstly, a plurality of the thermoelectric bars of P-type and N-type are placed along the rows of the matrix in such a manner that P-type bars alternate the N-type bars in a spaced relation along the column of the matrix. Then, the thermoelectric bars are bonded to the rows of the first contacts as well as to the rows of the second contacts to form a pre-assembly of a consolidated structure in which the thermoelectric bars are held between the first and second contacts. Thereafter, the thermoelectric bars and the second beams are simultaneously cut to divide the bars into the individual chips as well as to isolate the second discrete couples from each other. In this manner, the cutting can be made after stacking the bars between the first carrier and the second conductive plate into the consolidated structure so that the thermoelectric module can be obtained from the stacked structure while the latter being held stably during the cutting.

Preferably, the method may utilize the first carrier in the form of a first conductive plate including first beams for interconnection of the first couples within a horizontal plane in which the first contacts are arranged. Each of the first bridges and the inter-array bridge are offset from the horizontal plane in a direction away from the thermoelectric bars. With the use of this first conductive plate, the first discrete couples and the inter-array bridges can be formed from the first conductive plate by simultaneously cutting the first beams in addition to the thermoelectric bars and the second beams. Thus, only one cutting can be enough to divide the thermoelectric bars into the chips and isolate the second discrete couple out of the second conductive plate, yet to isolate the first discrete couples out of the first conductive plate, which facilities the production of the thermoelectric module by use of the first and second conductive plates each of unitary structure.

Further, it is advantageous to use the second conductive sheet in which the second beams are aligned in parallel with the column of the matrix and are configured so that the cutting is made through the entire length of the second conductive plate along lines in which the second beams are aligned. Therefore, the cutting can be all made from the same direction along several cutting lines in perpendicular to the length of the bars for cutting the bars into a plurality of the chips as well as the first and second conductive plates.

The above method is particularly found advantageous to fabricate a plurality of the thermoelectric modules successively on a single consecutive process line. For this purpose, there are provided a first tape carrying a plurality of the first conductive plates connected by first webs and a second tape carrying a plurality of the second conductive plates connected by second webs. The thermoelectric bars are secured between the respective pairs of the first and second conductive plates, after which the first and second beams of each of the first and second conductive plates are cut out together with thermoelectric bars to make a plurality of the thermoelectric modules which are connected by the first and second webs to each other. Then, the first and second webs are cut out for separating the individual thermoelectric modules from each other.

These and still other objects and advantageous features of the present invention will become more apparent from the following description of the embodiments when taken in conjunction with the attached drawings.

BRIEF DESCRIPTION OF THE DRAWINGS

FIG. 13 is a top view of the base plate;

FIG. 14 is a cross-section taken along line X—X of FIG. 13;

FIG. 15 is a cross-section taken along line Y—Y of FIG. 13;

FIG. 16 is a bottom view of the base plate;

FIG. 27 is a partially sectional view of a stack of the thermoelectric modules assembled into another heat-exchange device;

FIG. 28 is a top view of the two thermoelectric modules mounted on a single separable substrate for use in the above heat-exchange device;

FIG. 29 is a cross-section taken along line X—X of FIG. 28;

FIG. 42 is a top view of a base plate utilized in the thermoelectric module of FIG. 41;

FIG. 43 is a bottom view of the base plate;

FIG. 44 is a cross-section taken along line X—X of FIG. 42;

FIG. 45 is a cross-section taken along line Y—Y of FIG. 42;

FIG. 46 is a cross-section taken along line Z—Z of FIG. 42;

DETAILED DESCRIPTION OF THE PREFERRED EMBODIMENTS

Figure 1:
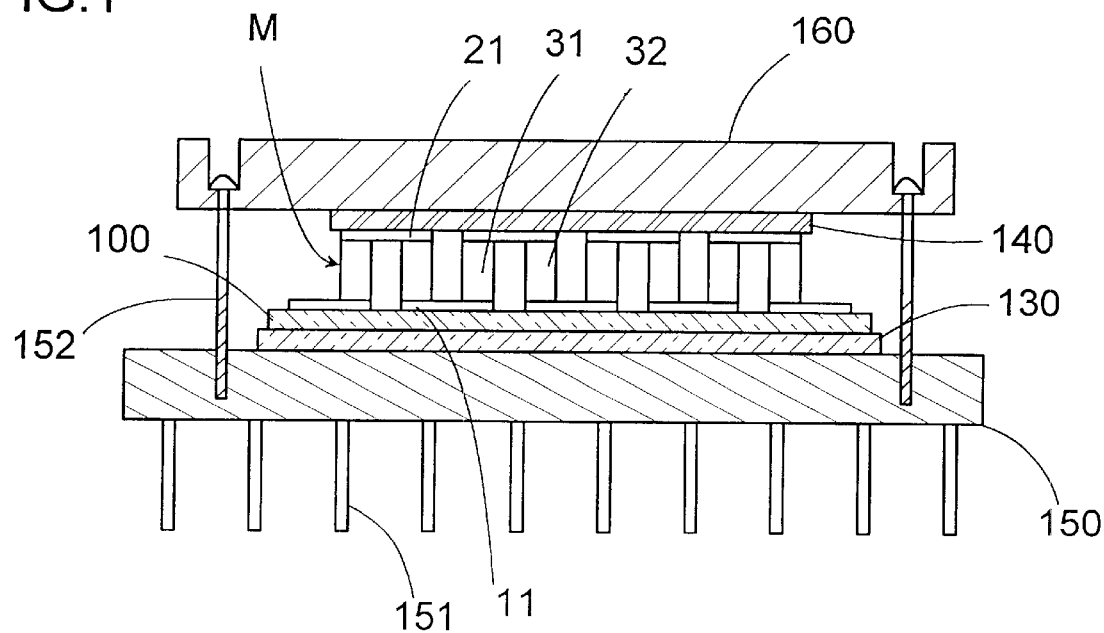
FIG. 1 is a partially sectional view of a thermoelectric module assembled into a heat-exchange device in accordance with a preferred embodiment of the present invention.
Figure 2:
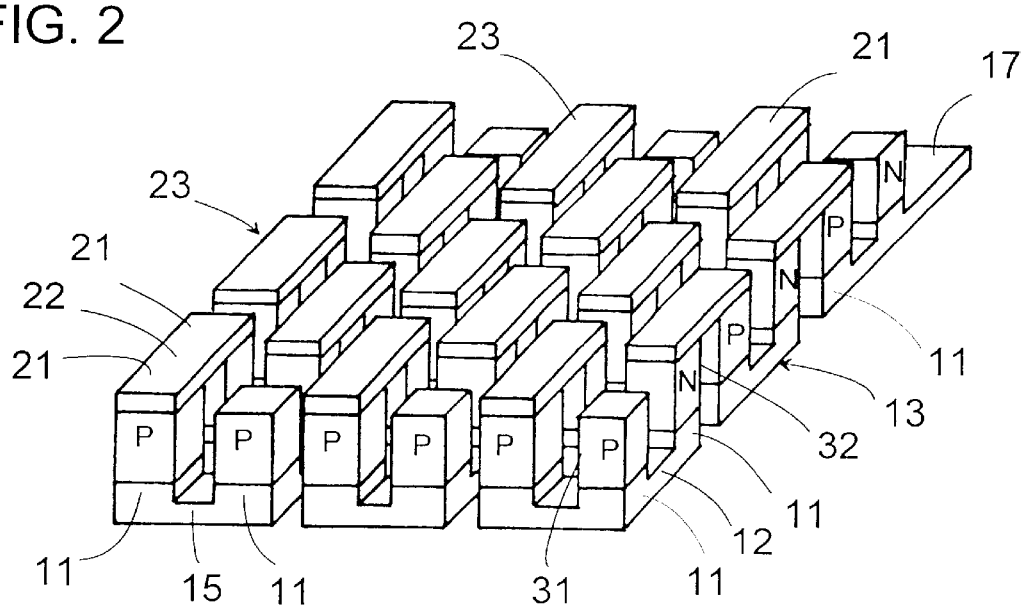
FIG. 2 is a perspective view of the thermoelectric module.
Figure 3:
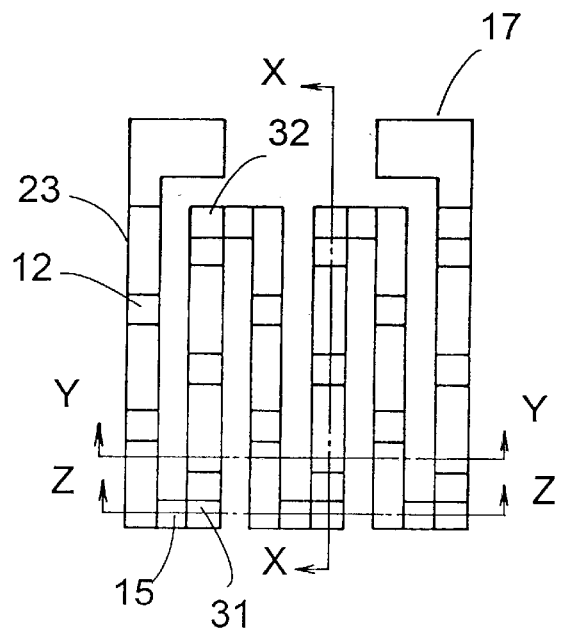
FIG. 3 is a top view of the thermoelectric module.
Figure 4:
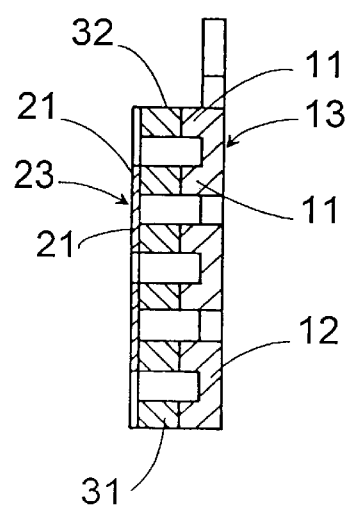
FIG. 4 is a cross-section taken along line X—X of FIG. 3.
Figure 5:
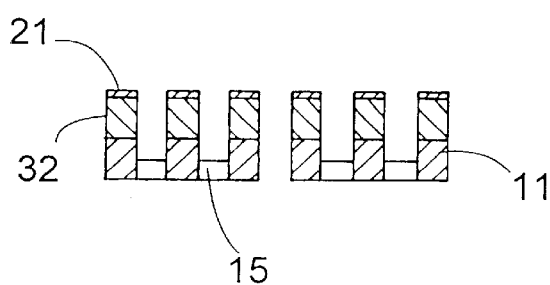
FIG. 5 is a cross-section taken along line Y—Y of FIG. 3.
Figure 6:
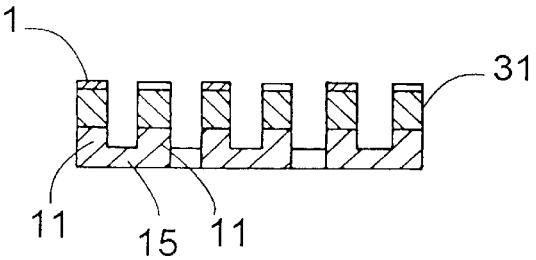
FIG. 6 is a cross-section taken along line Z—Z of FIG. 3.

A thermoelectric module in accordance with one preferred embodiment of the present invention is now discussed herein. As shown in FIG. 1, the thermoelectric module M is adapted in use to be held between a bottom layer 130 and a top layer 140 and incorporated in a heat-exchange device which includes a bed 150 with heat radiating fins 151 and an applicator panel 160. The applicator panel 160 is fixed to the bed 150 by means of screw 152 and is utilized as a heat-exchange surface for a cooling or heating purpose. The bottom layer 130 is made of a hard polymer having good thermal conductivity, while the top layer 140 is made of a gel, i.e., a jellylike dielectric polymer having good thermal conductivity in order to absorb heat-stress developed at the interface between thermoelectric module M and the applicator panel 160.

As shown in FIGS. 2 to 6, the thermoelectric module M is composed of a plurality of thermoelectric chips of P-type and N-type 31 and 32 which are arranged in a matrix to have more than two chip arrays each extending along the column of the matrix and electrically connected in series by means of first and second contacts 11 and 21 which are disposed on opposite faces of the chips, respectively. Two adjacent ones of the first contacts 11 in each column are connected by first bridges 12 to form first discrete couples 13 for electrical connection of the chips in each chip array. Likewise, two adjacent ones of the second contacts 21 in each column are connected by second bridges 22 to form second discrete couples 23. The chip arrays are interconnected by inter-array bridges 15 which are formed solely on the side of the first contacts to bridge the two adjacent first contacts 11 at the outermost rows of the matrix. Thus, the individual chip arrays are electrically interconnected through the inter-array bridges 15 while leaving the second discrete couples 23 completely isolated from each other on the top side of the thermoelectric module M. In use, the first couples 13 are fixedly supported by a dielectric rigid substrate 100 made of a ceramic or resin to be restrained thereto. As shown in FIG. 1, the rigid substrate 100 is held on the bed 150 through the bottom layer 130, while the gel layer 140 is directly mounted on the second couples 23 under the applicator panel 160. Since the second discrete couples 23 are completely isolated from each other and are thermally communicated with the applicator panel only through the gel layer 160, the heat stress accumulated on the thermoelectric module during the use can be well relieved on the top side thereof, protecting the module from undesired breakage or disconnection. A pair of terminal lugs 17 extend respectively from the first contacts 11 at the ends of the two outermost columns for wiring connection to an external voltage source. By flowing a current in a selective direction to the circuit of the thermoelectric module, the top side of the module is cooled due to the Peltier effect at the chips, while the opposite side of the module is heated, or vise versa.

Figure 7:
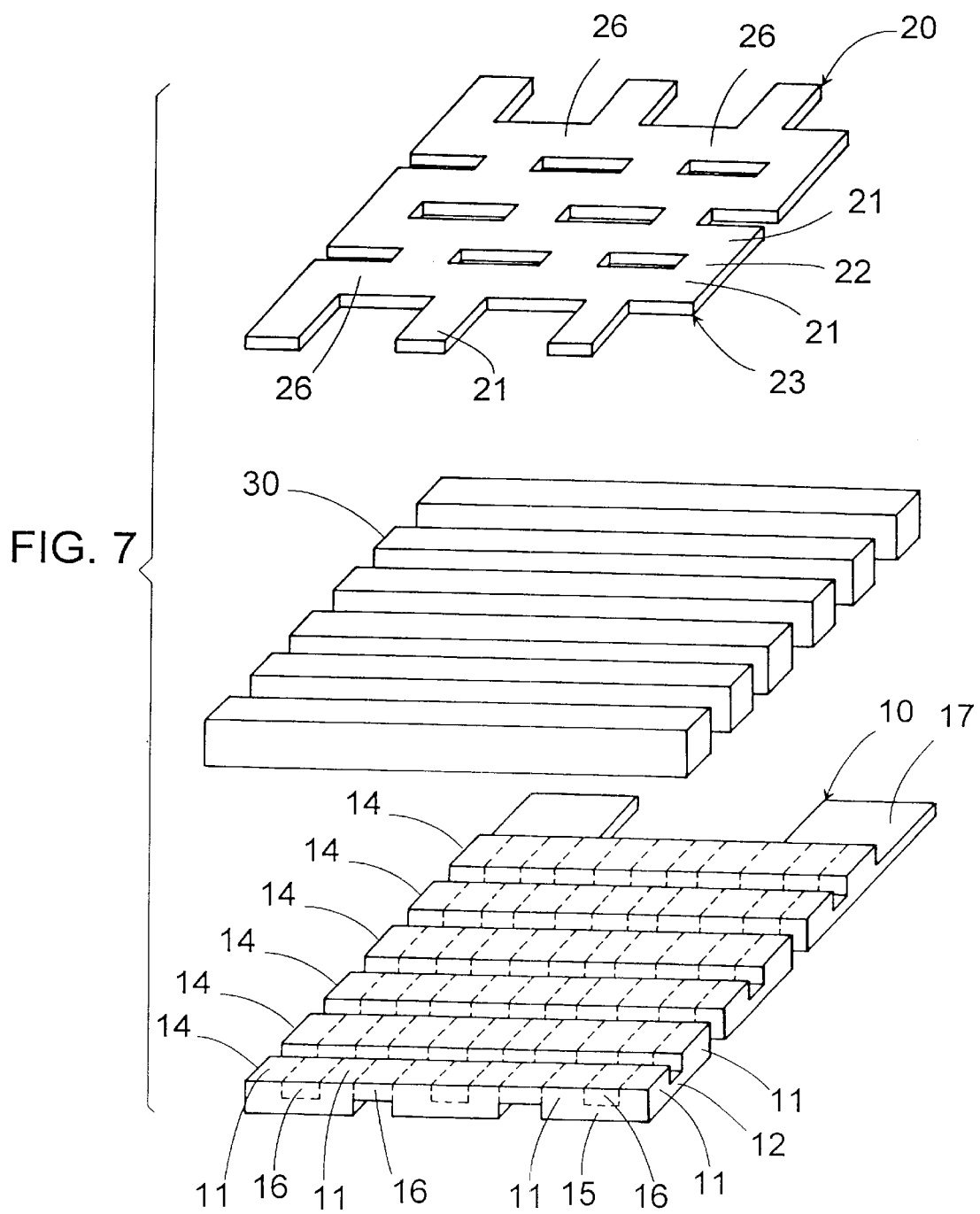
FIG. 7 is an exploded perspective view illustrating a base plate, a set of thermoelectric bars, and a top plate which are stacked into a pre-assembly of a unitary structure from which the thermoelectric module is cut out.
Figure 12:
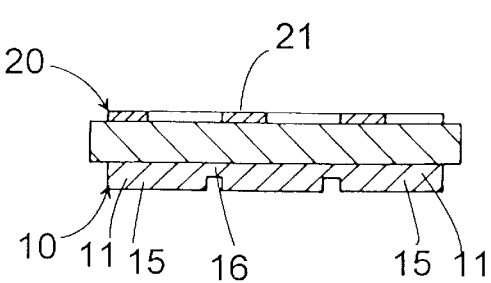
FIG. 12 is a cross-section taken along line Z—Z of FIG. 9

As shown in FIGS. 7 to 12, the above thermoelectric module is obtained by cutting in a pre-assembly formed by a stack of a base plate 10, a plurality of thermoelectric bars of P-type and N-type 30, and a top plate 20. The base plate 10 is made of an electrically conductive material such as copper into a unitary structure from which the first discrete couples 13 of the first contact 11 as well as the inter-array bridge 15 are formed by the cutting. The top plate 20 is also made of an electrically conductive material such as copper into a unitary structure from which the second discrete couples 23 of the second contacts 21 are formed by the same cutting. In detail and also with reference to FIGS. 13 to 16, the base plate 10 is shaped to have six parallel blocks 14 which are connected by the horizontally spaced first bridges 12, as shown in FIG. 13. Each block 14 is subsequently divided into a set of the first contacts 11 horizontally spaced along the row of the matrix. That is, the first contacts 11 are connected by first horizontal beam 16 in the upper half of the block 14, as shown in FIG. 15. The two outermost blocks 14 are further shaped to include the inter-array bridge 15 interconnecting the two adjacent ones of the first contacts 11 in the lower half of the block 14, as shown in FIGS. 7 and 12. The first beams 16 are aligned in five parallel paths along the column of the matrix to define five cutting lines extending over the entire vertical length of the base plate 10. Cutting of the base plate 10 is made along the cutting lines to entirely remove the first beams 16 so as to separate the first contacts 11 with respect to the horizontal direction, i.e., along the rows of the matrix, while leaving the two vertically adjacent ones of the first contacts 11 connected by the first bridges 12 formed in the lower half of the base plate 10. The terminal lugs 17 extend from the lower half of the one outer block 14 to remain after the cutting.

Figure 8:
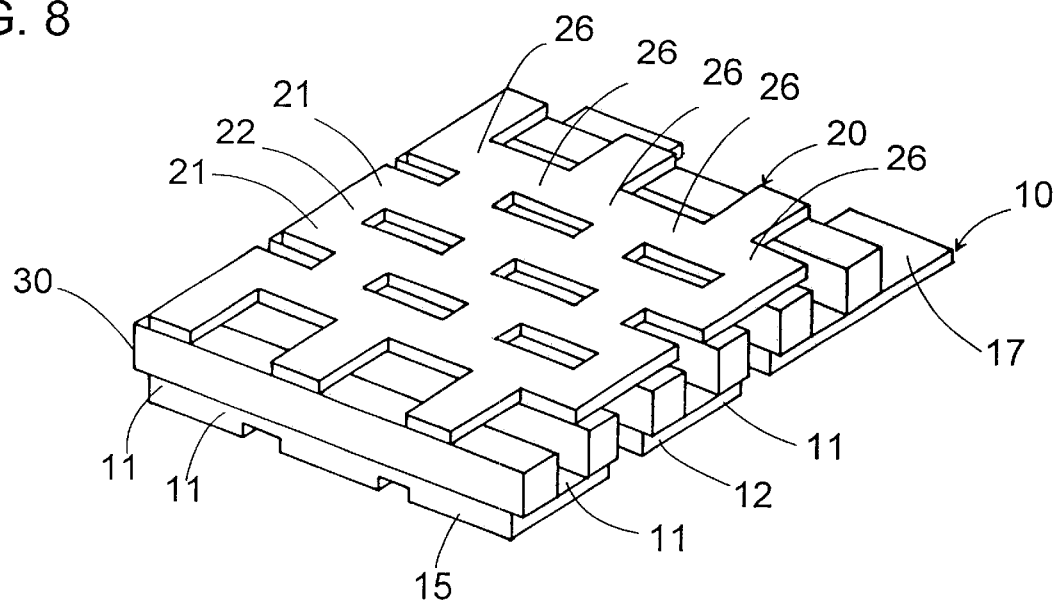
FIG. 8 is a perspective view of the above pre-assembly.
Figure 9:
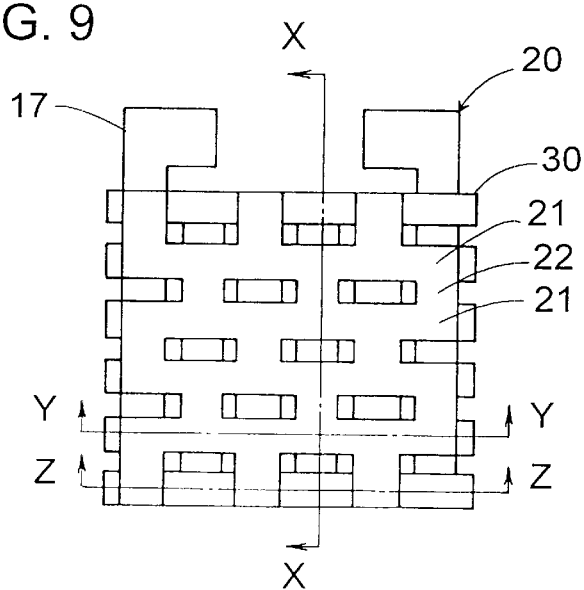
FIG. 9 is a top view of the pre-assembly.
Figure 10:
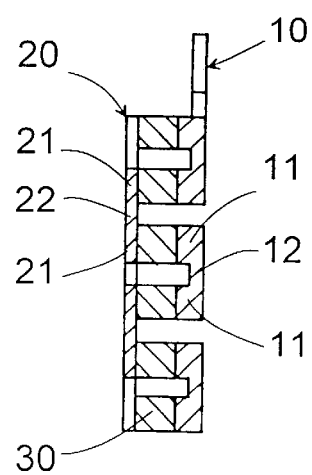
FIG. 10 is a cross-section taken along line X—X of FIG. 9.
Figure 11:
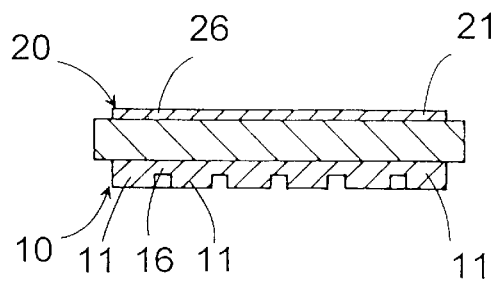
FIG. 11 is a cross-section taken along line Y—Y of FIG. 9.

Also with reference to FIGS. 7 and 8, the top plate 20 is shaped to have the second contacts 21 connected by second horizontal beams 26 such that the second couples 23 of the second contacts 21 in one column are staggered to those in the adjacent column. The second contacts 21, the second bridges 22 forming the second couples 23, and the second horizontal beams 26 are of the same thickness and are disposed within the same plane. The second horizontal beams 26 are aligned along the five parallel paths respectively in exact correspondence to the cutting lines so that the second beams 26 are completely removed by the cutting to provide the second discrete couples 23 totally separated from each other. The base plate 10 and the top plate 20 can be shaped into the individual configurations by press-forming, cutting, or etching the blank plates.

The pre-assembly of FIG. 8 is obtained by bonding the thermoelectric bars 30 of the different types on the blocks 14 of the base plate 10 while arranging the bars of different types alternately in the column direction, followed by bonding the top cover 20 on the bars 30 in exact registration between the second beams 26 and the first beam 16 of the base plate 10. Thereafter, the cutting is made along the cutting lines to divide the bars into the chips 31 and 32, and at the same time to separate the first discrete couples 13 from each other as well as the second discrete couples 23 from each other. In this manner, only the one cutting process from one direction is sufficient to obtain the thermoelectric module M from the sub-assembly even with the use of the thermoelectric bars 30, the base plate 10 and the top plate 20 both of unitary structure, thereby greatly facilitating the fabrication of the thermoelectric module.

Figure 17:
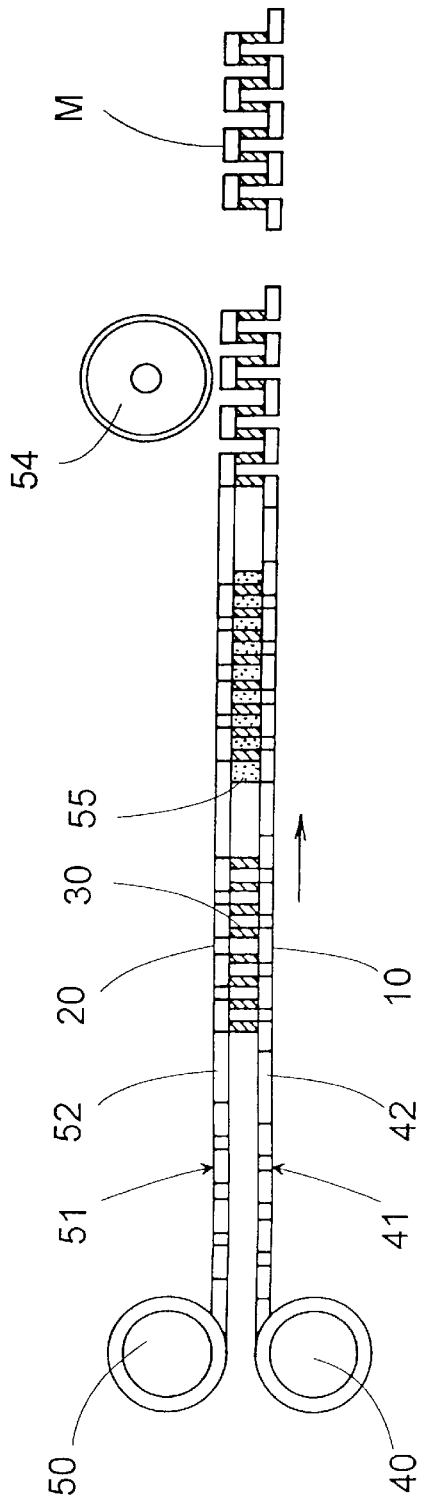
FIG. 17 is a schematic view illustrating a continuous process of fabricating a plurality of the thermoelectric modules.

In fact, the above fabrication method is particularly advantageous in providing a plurality of the thermoelectric modules M in a continuous line, as shown in FIG. 17. This continuous process utilizes a first tape 41 having a series of the base plates 10 connected by first webs 42 and a second tape 51 having a series of the top plate 20 connected by second webs 52. The first and second tapes 41 and 51 are unwound from respective rolls 40 and 50 and are fed in one direction in parallel with each other during which the thermoelectric bars 30 are bonded to the base plates 10 and the top plates 20 to form a series of the pre-assemblies. The pre-assemblies are then cut into individual skelton structures of the thermoelectric modules M by use of rotary cutters 54 arranged along a direction perpendicular to the feeding direction. Thereafter, the skelton structures of individual modules M are cut apart at the first and second webs. It is preferred to fill a dielectric resin 55 between the base plates 10 and the top plates 20 prior to cutting the pre-assemblies in order to protect the thermoelectric bars from being fractured at the time of cutting the bars into the chips. Thus obtained skelton strcuture of the thermoelectric module M is supported on a dielectric substrate 100 made of alumina or the like solid material backing the set of the first couples 13 of the first contacts 12 to securely hold the whole module. That is, the first couples 13 and the inter-array bridges 15 are bonded on the substrate 100.

Alternately, the thermoelectric module M may be fabricated in a batch process in which a single module is obtained from pre-assembly formed of the stack of the base plate 10, the bars 30 and the top plate 20. In this process, the base plate 10 is supported on the like dielectric substrate 100 by bonding the bottoms of the base plate 10 to the substrate 100 so that the first beams 16 are spaced from the substrate to be successfully removed by the subsequent cutting without causing any interference with the substrate. The bonding of the base plate 10 is made by for example, a so-called direct bonging copper (DBC) method in which the bottom of the base plate is partially transformed by application of heat to a copper oxide which is responsible for a strong bonding between the base plate and the substrate. Further, since the first bridges of the first contacts as well as the inter-array bridges are held secured to the substrate, the subsequent cutting of the first beams can be made accurately and easily with the first contact kept in the correct positions. It is noted in this connection that two or more modules may be fabricated in a like batch process by utilizing a corresponding number of the base plates and the top plates which are coupled by first and second joints, respectively into first and second sheets. The thermoelectric bars are held between the two sheets to make the plural stacks of the base plates, the thermoelectric bars, and the top plates. Thereafter, the individual stacks are cut into the individual modules which are then cut apart at the first and second joints. In this instance, only one cutting operation is sufficient for fabricating the modules from the pre-assemblies when the base plates and the top plates are aligned, respectively.

Figure 18:
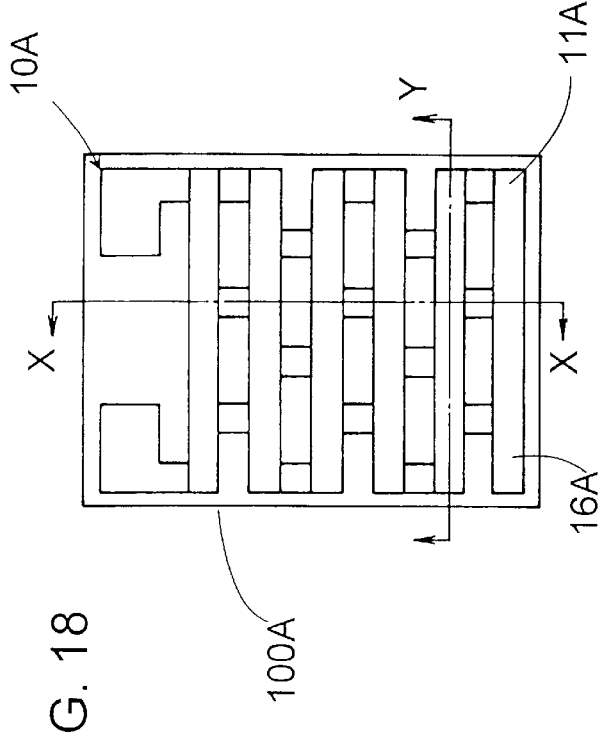
FIG. 18 is a top view of a base plate partially embedded in a dielectric substrate which may be utilized in the present invention.
Figure 19:
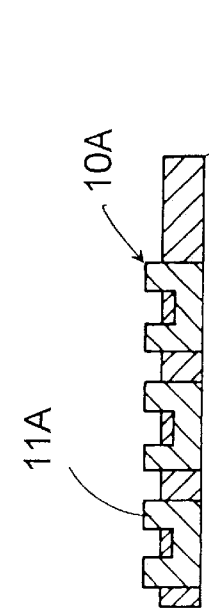
FIG. 19 is a cross-section taken along line X—X of FIG. 18.
Figure 20:
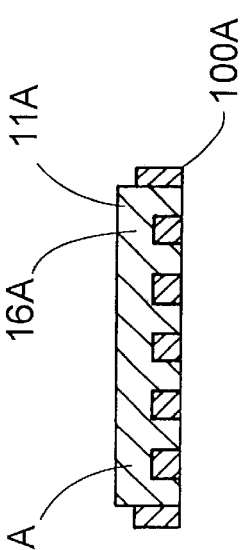
FIG. 20 is a cross-section taken along line Y—Y of FIG. 18.

As shown in FIGS. 18 to 20, the base plate 10A may be partially embedded in a dielectric resin substrate 100A of molded plastic material to be securely supported thereby. The plastic material may be thermosetting resin such as epoxy, phenol, and polyimide or thermoplastic resin such as PPS, liquid crystal polymer, and polyetherketone. The first contacts 11A project on top of the resin substrate 100A, but the first beam 16A may be partly embedded in the resin substrate 100A so as to be removed together with the upper part of the substrate at the cutting. The bottom of the base plate 10A is made flush with the bottom of the resin substrate 100A so that the base plate 10A has its bottom totally exposed to give an exposed pattern of the same configuration as shown in FIG. 16. Thus, the heat can be transferred from the base plate 10A to a supporting structure, e.g., the bed 150 of FIG. 1 without being hampered by the resin substrate 100A.

Figure 21:
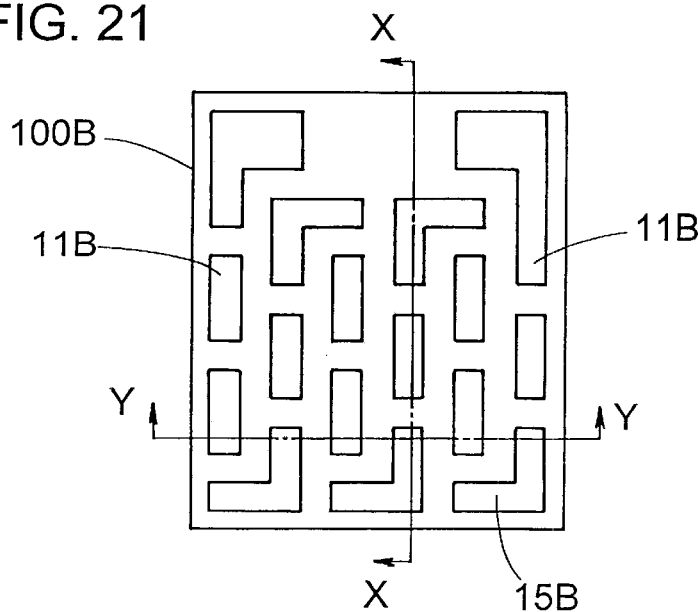
FIG. 21 is a top view of a substrate carrying first contacts and first bridges which may be utilized in the present invention.
Figure 22:
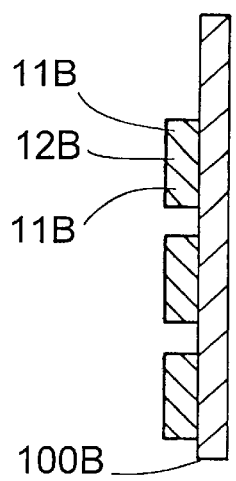
FIG. 22 is a cross-section taken along line X—X of FIG. 21.
Figure 23:
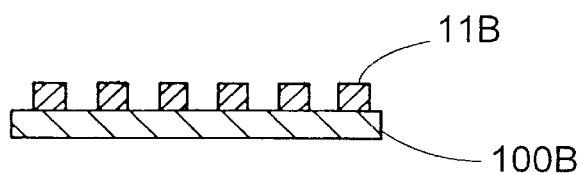
FIG. 23 is a cross-section taken along line Y—Y of FIG. 21.

FIGS. 21 to 23 show a modification in which a set of first contacts 11B are supported on a dielectric substrate 100B together with the first bridges 12B and the inter-array bridges 15B but without the first beam. Thus, the first discrete couples 13B are formed on the substrate without requiring the subsequent cutting. The substrate 100B may be made of alumina or the like solid material.

Figure 24:
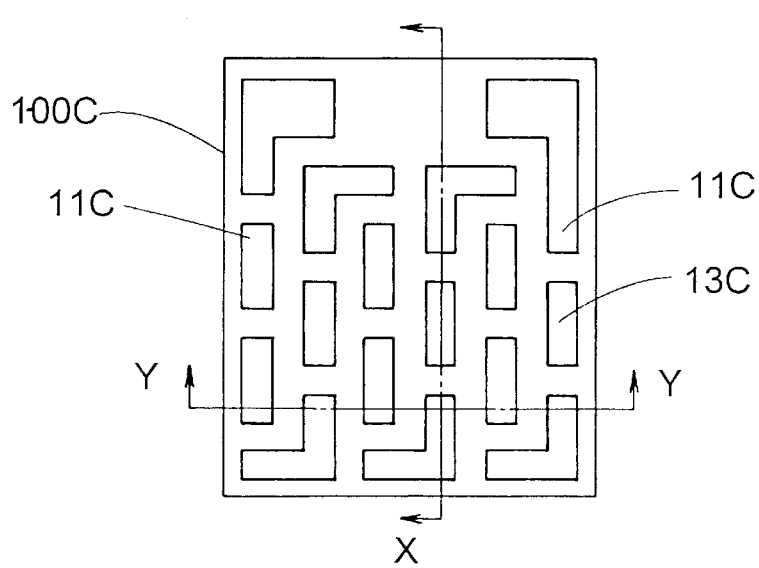
FIG. 24 is a top view of a substrate carrying first contacts and first bridges which may be utilized in the present invention.
Figure 25:
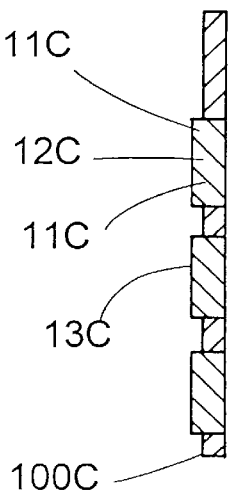
FIG. 25 is a cross-section taken along line X—X of FIG. 24.
Figure 26:
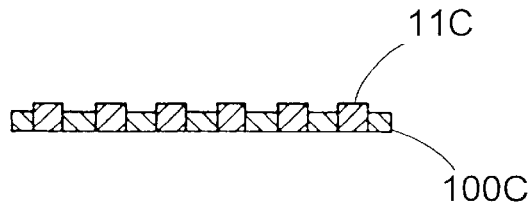
FIG. 26 is a cross-section taken along line Y—Y of FIG. 24.

FIGS. 24 to 26 show another modification in which a set of first contacts 11C are partly embedded in a dielectric resin substrate 100C together with the first bridges 12C as well as the inter-array bridges 15C. No first beam is provided so that the first discrete couples 13C are exposed on the resin substrate 100C without requiring the subsequent cutting. The first contacts 11C and the associated parts are exposed on the bottom of the resin substrate 100C.

As shown in FIG. 27, two thermoelectric modules M may be stacked to form a dual heat exchange device. For this application, it is advantageous to fabricate the two modules M on a single dielectric substrate 100D, as shown in FIGS. 28 and 29. The base plate or the first contacts 11D are bonded to the substrate prior to cutting the thermoelectric bars and the top plate into the individual chips and the second discrete couples 23D of the second contacts 21D. The pre-assemblies of the two modules M are arranged to align the cutting lines CL for requiring only one cutting process when fabricating the two modules. The substrate 100D is formed with a notched groove 101 intersecting the cutting lines for separating the two modules. Thus separated modules M are stacked as shown in FIG. 27 while establishing electrical connections between the respective terminal lugs.

Figure 30:
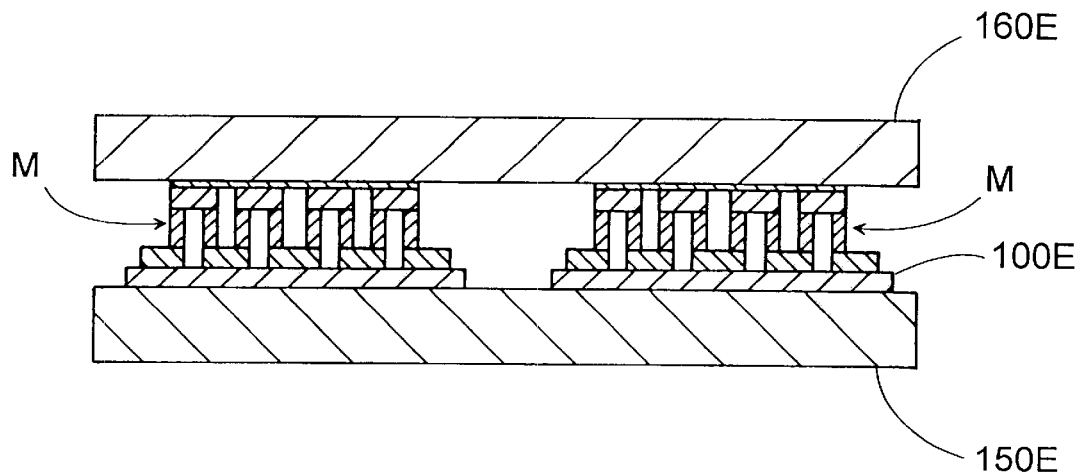
FIG. 30 is a partially sectional view of a further heat-exchange device in which the two thermoelectric modules are arranged in the same plane.
Figure 31:
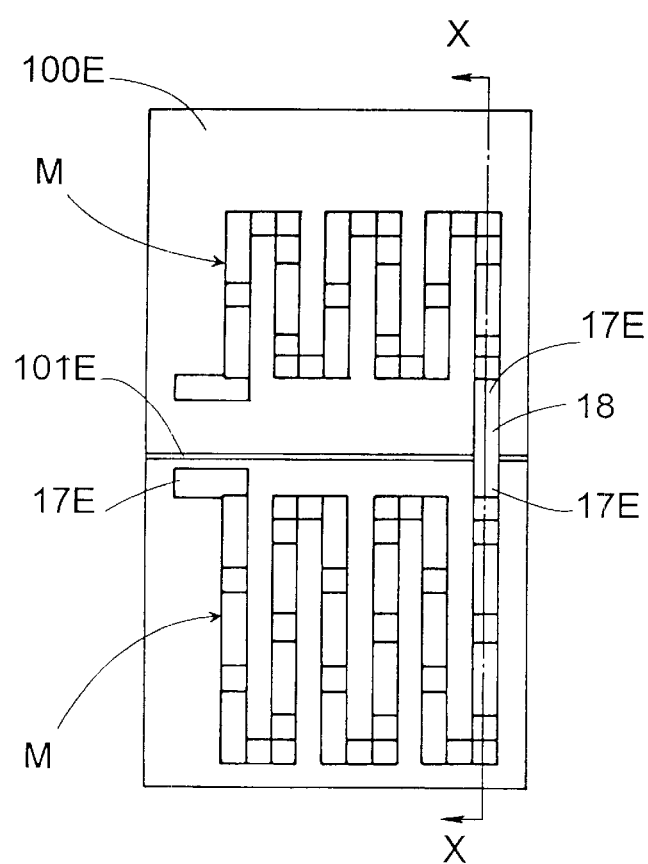
FIG. 31 is top view of the two thermoelectric modules mounted on a single separable substrate with individual circuits of the first contacts being interconnected by an extension bridge.
Figure 32:
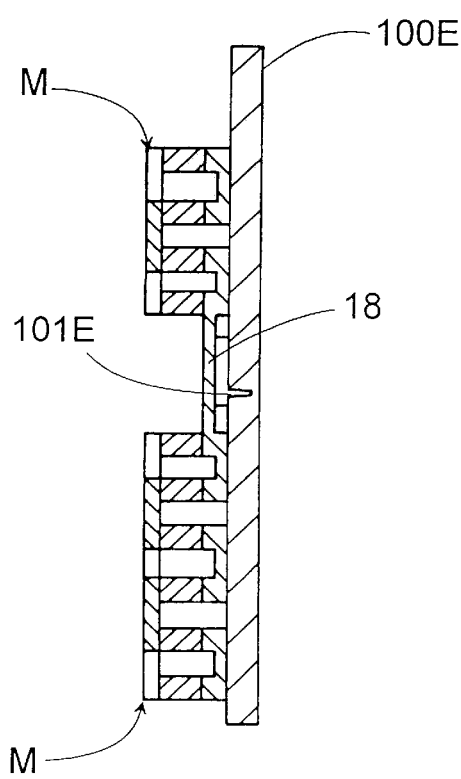
FIG. 32 is a cross-section taken along line X—X of FIG. 31.
Figure 33:
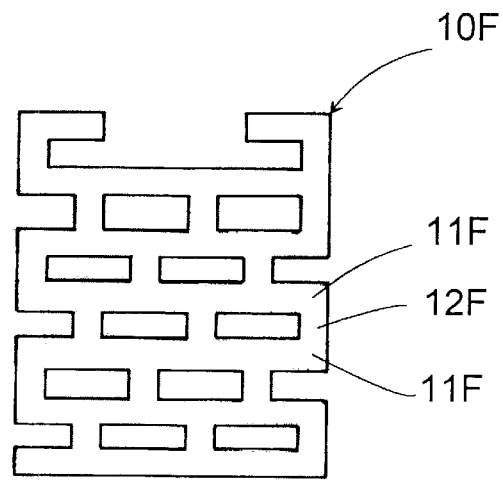
FIG. 33 is a top view of another base plate which may utilized in the present invention.
Figure 34:
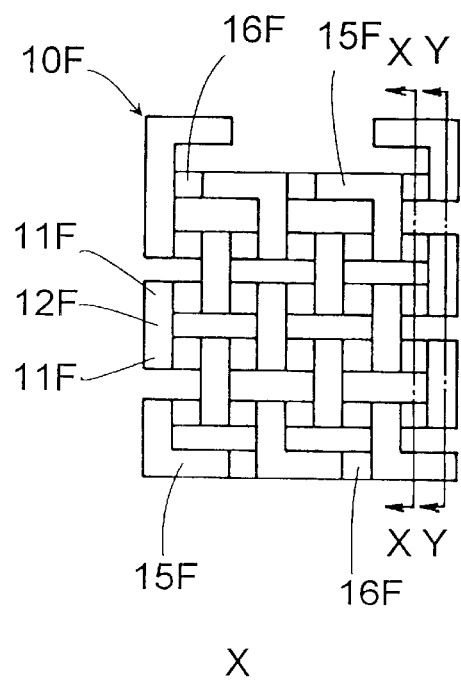
FIG. 34 is a bottom view of the base plate of FIG. 33.
Figure 35:
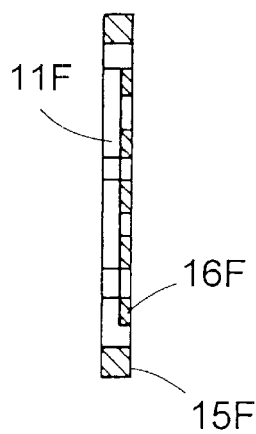
FIG. 35 is a cross-section taken along line X—X of FIG. 34.
Figure 36:
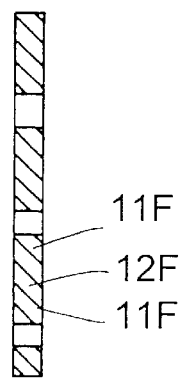
FIG. 36 is a cross-section taken along line Y—Y of FIG. 34.
Figure 37:
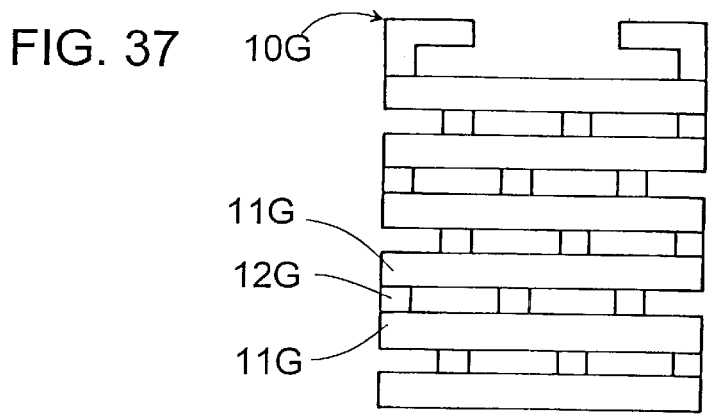
FIG. 37 is a top view of another base plate which may utilized in the present invention.
Figure 38:
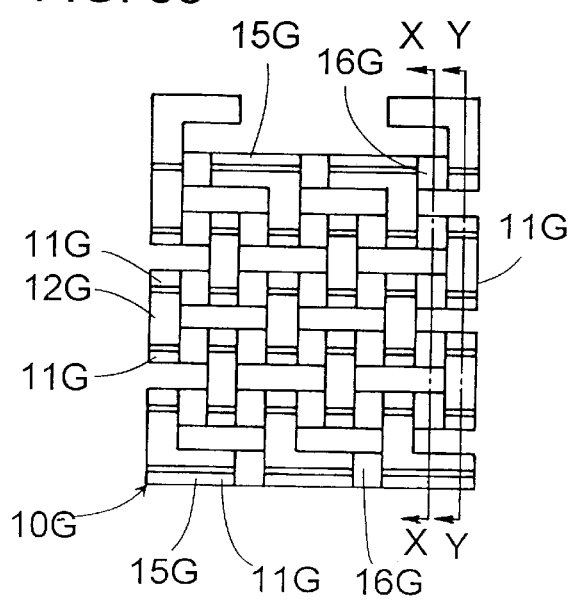
FIG. 38 is a bottom view of the base plate of FIG. 37.
Figures 39, 40:
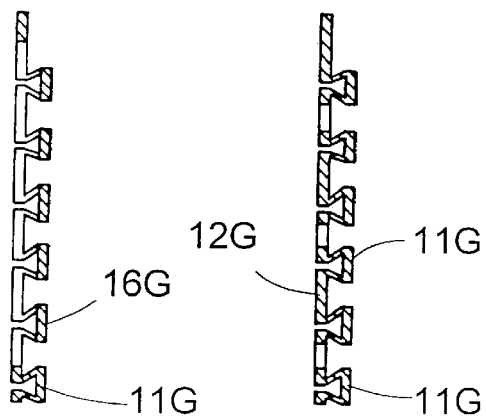
FIG. 39 is a cross-section taken along line X—X of FIG. 38.
FIG. 40 is a cross-section taken along line Y—Y of FIG. 38.

FIG. 30 shows a further heat-exchange device in which the two thermoelectric modules M are mounted in the same level between the bed 150E and the applicator panel 160E. The two modules M can be formed on a single dielectric substrate 100E with a notched groove 101E, as shown in FIGS. 31 and 32 and are separated subsequently at the notched groove 10E. One of the terminal lugs 17E of each module is integrally connected by an extension bridge 18 which is capable of being deformed to allow the separated modules to rotate in the same plane relative to each other. For this purpose, the extension bridge 18 is located at one corner of the module M. The extension bridge 18 may be optionally cut to give two independent modules.

FIGS. 33 to 36 show a modified base plate 10F which may be equally utilized in the present invention. The base plate 10F has a flat top surface on which the first contacts 11F, the first bridges 12F and the first beams 16F are exposed, while the bottom surface of the base plate 10F is concaved at portions corresponding to the first beams 16F. That is, the first bridge 12F has a thickness equal to that of the first contact 11F and connects the two adjacent first contacts within the same plane, while the first beam 16F has a thickness less than that of the first contact 11F and has its top surface flush with the top surface of the first contact receiving the thermoelectric bar. The base plate 10F of this configuration can be easily obtained by press-forming.

FIGS. 37 to 40 show a further modified base plate 10G which may be also utilized in the present invention. The base plate 10G is formed from a blank sheet of uniform thickness to give first contacts 11G by partially cutting and bending the sheet. The resulting first contacts 11G are interconnected by first bridges 12G of straight configuration to define respective first discrete couples 13G. First beams 16G of straight configuration interconnects the first contacts 11G in the adjacent columns. The first contacts 11G at opposite ends of the column are connected to those of the adjacent column by inter-array bridges 15G which is also formed by partially cutting and bending the sheet. Thus, the base plate 10G can be easily prepared also by press-forming.

Although the above illustrated embodiment and its modifications all show an arrangement of using even number of the rows of the chips, the present invention is not limited thereto and may include an odd number of the rows of the chips only by a slight design alternation for the arrangement of the first and second contacts.

Figure 47:
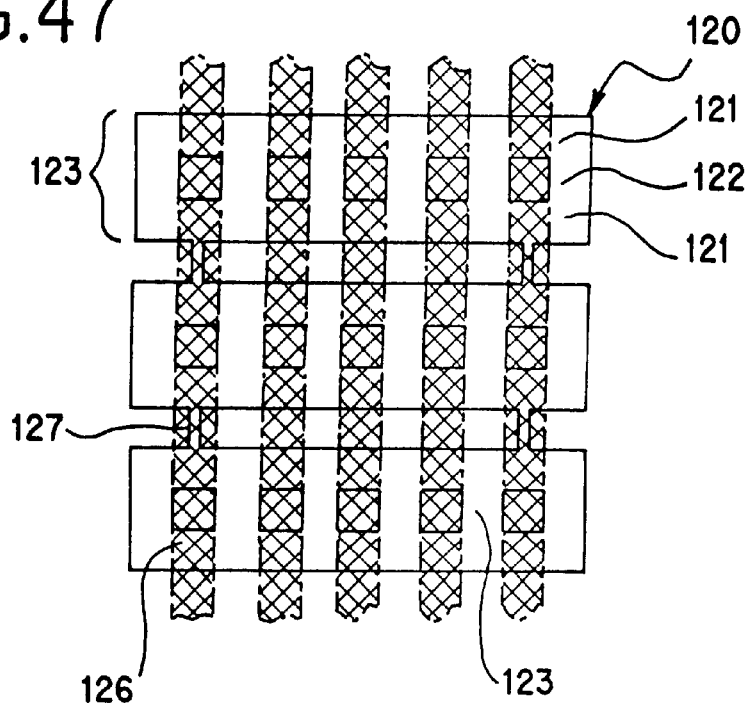
FIG. 47 is a top view of a top plate shown with cut-away portions in a subsequent step of fabricating the thermoelectric module.
Figure 48:
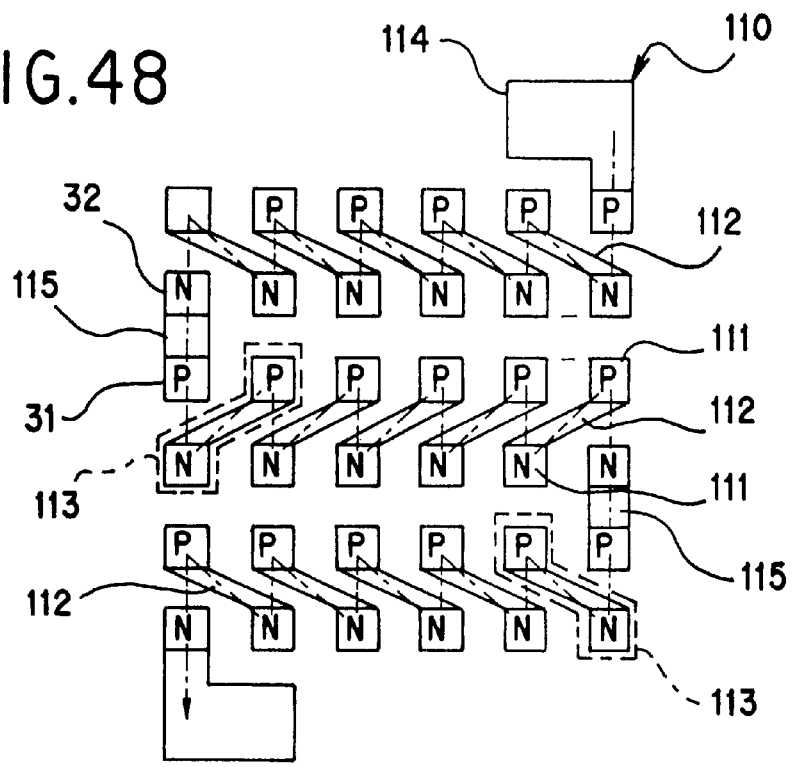
FIG. 48 is a top view of the thermoelectric module shown with the top plate being removed.

FIGS. 41 to 48 show a thermoelectric module M in accordance with another preferred embodiment of the present invention. The module M of this embodiment includes a plurality of thermoelectric chips 31 and 32 of different types which are arranged in a matrix and are connected in an exact alternate sequence to form a series circuit without leaving any direct connection of the chips of the same type as seen in the previous embodiment at connections by the inter-array bridges. The resulting circuit is adapted to flow an electric current as indicated by arrowed line in FIG. 48. This embodiment utilizes a combination of a base plate 110 and the top plate 120 of unique configurations so as to give three chip arrays each defined by the chips 31 and 32 arranged in a pair of the two adjacent rows of the matrix, the first contacts 111 in a corresponding pair of the two adjacent rows, and second contacts 121 in a corresponding pair of the two adjacent rows of the matrix, as shown in FIG. 48. The first contacts 111 in each row of the matrix are connected to those on the adjacent row by means of first oblique bridges 112, while the first contacts 111 on the same row are integrally connected by first horizontal beams 116 which are subsequently cut away to give first discrete couples 113 of the first contacts 112, as indicated by dotted lines in FIGS. 42 and 43. The three chip arrays are connected by inter-array bridges 115 extending between the two first contact 111 at ends of the two oppose rows. The base plate 110 is also formed with first vertical beams 119 which interconnect the first horizontal beams 116 at one ends of the adjacent rows opposite of the inter-array bridge 115. A pair of terminal lugs 117 extend from the first contacts at the outermost rows for electrical connection with a voltage source.

Figure 41:
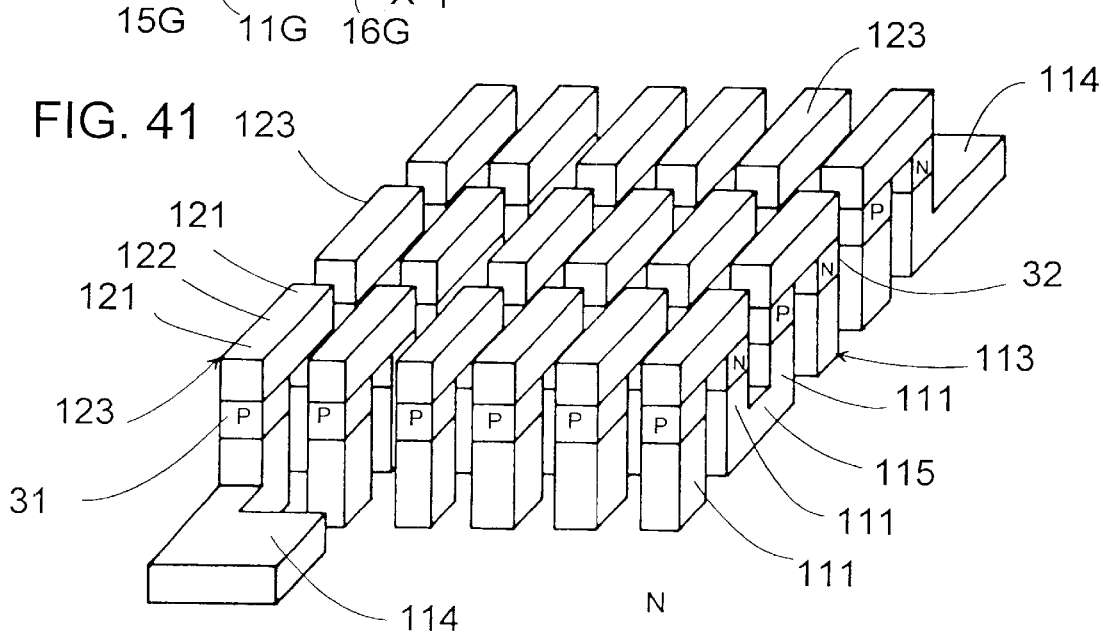
FIG. 41 is a perspective view of a thermoelectric module in accordance with another preferred embodiment of the present invention.

As shown in FIG. 47, the top plate 120 has a uniform thickness and is shaped to include three blocks each composed of two rows of second contacts 121. Each pair of the second contacts 121 across the two rows are integrally connected by a second vertical bridge 122, while the second contacts 121 in each row are connected to each other by second horizontal beams 126 which are subsequently cut away together with the bars 30 and first beams 116 and 119 to give second discrete couples 123, as shown in FIGS. 41 and 47. The second couples 123 are aligned in the column as well as in the row directions.

In the same fashion as in the previous embodiment, the module M is fabricated from a sub-assembly which is a stack of the base plate 110, thermoelectric bars, and the top plate 120. That is, portions indicated by cross-hatched lines in FIG. 47 are cut away to remove the second horizontal beams 126, the first horizontal beams 116 as well as the first vertical beams 119, at the same time of cutting the bars into the individual chips 31 and 32, thereby isolating the second discrete couples 123 on the top side of the module and isolating the first discrete couples 113 on the bottom side of the module, while leaving the inter-array bridges 115 for electrical interconnection between first contacts of the adjacent chip arrays. For this purpose, the first oblique bridges 112 and the inter-array bridges 115 are formed in the lower half of the base plate 110 to remain after the cutting, while the first horizontal beams 116 and the first vertical beams 119 are formed in the upper half of the base plate 110 to be cut away.

The above arrangement including the first couples 123 of the first contacts 121 connected by the first oblique bridges 122 and the associated parts is found advantageous also for the two chip arrays in a sense of eliminating the direct connection of the chips of the same type at the juncture of the chip arrays. It is noted at this time that thus fabricated module M may be also utilized in the heat-exchange devices as shown in FIGS. 1, 27, and 30. Although not shown in the figures, the base plate 110 is held by a rigid dielectric substrate such as a ceramic substrate 100 or resin substrate 100A as utilized in the previous embodiment so that the first couples 130 are fixed or restrained by the dielectric substrate. The thermoelectric module M thus fabricated is incorporated in a heat-exchange device in a like fashion as shown in FIG. 1 with the rigid substrate held on a bed 150 through a bottom layer 130 and with a gel layer 140 interposed between the second couples 123 and an applicator panel 160. Further, the module M may be formed in a continuous process as shown in FIG. 17. In this case, the substrate may be bonded to the first couples 113 after making the simultaneous cutting of the base plate, the top plate, and the thermoelectric bars.

List of Reference Numerals

10 base plate
11 first contact
12 first bridge
13 first discrete couple
14 block
15 inter-array bridge
16 first horizontal beam
17 terminal lug
18 extension bridge
20 top plate
21 second contact
22 second bridge
23 second discrete couple
26 second horizontal beam
40 roll
41 first tape
42 first web
50 roll
51 second tape
52 second web
54 rotary cutter
55 dielectric resin
100 substrate
101 notched groove
110 base plate
111 first contact
112 first oblique bridge
113 first discrete couple
114 terminal lug
115 inter-array bridge
116 first horizontal beam
119 first vertical beam
120 top plate
121 second contact
122 second bridge
123 second couple
126 second horizontal beam
130 bottom layer
140 top layer
150 bed
151 heat radiation fin
152 screw
160 applicator panel

What is claimed is:

1. A method of fabricating a thermoelectric module, said module composed of:

a plurality of thermoelectric chips of P-type and N-type for subsequently separating the bars into a plurality of thermoelectric chips of P-type and N-type arranged in a matrix between a set of first contacts and a set of second contacts both arranged in said matrix to form a series connected electrical circuit which is adapted to flow an electric current therethrough in a selected direction for heating and cooling one side of the first and second contacts due to the Peltier effect at said chips, a first carrier carrying the set of said first contacts and including first bridges each integrally joining two adjacent first contacts to define first discrete couples for electrical connection of said chips in each of said chip arrays, said first carrier further including at least two inter-array bridges which are solely responsible for electrical connection between the adjacent chip arrays, a second conductive plate carrying the set of said second contacts and including second bridges each integrally joining the two adjacent second contacts to give second discrete couples for electrical connection of the two adjacent chips in each of said chip arrays on opposite side of said first contacts, said second conductive plate further including second beams which integrally connect said second discrete couples in order that all of said second discrete couples are retained to said second conductive plate, said chips being arranged to provide at least three chip arrays each having a limited number of said chips, said method comprising the steps of:

placing a plurality of said thermoelectric bars of P-type and N-type along the rows of said matrix in such a manner that P-type bars alternate the N-type bars in a spaced relation along the column of said matrix;

bonding said thermoelectric bars to the rows of said first contacts as well as to the rows of said second contacts to form a consolidated structure in which said thermoelectric bars are held between the first and second contacts; and cutting said thermoelectric bars as well as said second beams simultaneously to divide said thermoelectric bars into said chips and to isolate said second discrete couples from each other;

wherein both said first contacts and said second contacts are bonded prior to said cutting step, and said second beams are aligned in parallel with the column of said matrix, said cutting being made through the entire length of said second conductive plate along lines in which said second beams are aligned.

2. The method as set forth in claim 1, wherein said first carrier further comprises a first conductive plate which includes a first beams interconnecting said first couples within a horizontal plane in which said first contacts are arranged, each of said first bridges and said inter-array bridge being offset from said horizontal plane in a direction away from said thermoelectric bars, said method further includes cutting said first beams to isolate said first discrete couples from each other except at said inter-array bridge at the same time of cutting said thermoelectric bars and said second beams.

3. The method as set forth in claim 2, wherein said first conductive plate is cut at said first beams along the same planes in which said second conductive plate is cut into said second discrete couples.

4. The method as set forth in claim 1, wherein each of said chip arrays is defined by said chips, said first contacts, said second contacts, all arranged along each column of said matrix;

said first bridges being first vertical bridges each integrally joining the two adjacent first contacts in each column of said matrix to give said first discrete couples;

said inter-array bridge joining the two adjacent first contacts in the outermost row of said first matrix to form a horizontal couple for electrical interconnection between said adjacent chip arrays each arranged along the column of said matrix, said second bridges being second vertical bridges each integrally joining the two adjacent second contacts in each said column of said matrix to give said second discrete couples;

said second beam horizontally interconnecting said second discrete couples within a thickness of said second contacts in such a manner that said second discrete couples arranged along one column of said matrix are uniformly staggered with respect to said second discrete couples arrange along the adjacent column of said matrix.

5. The method as set forth in claim 1, wherein each of said chip arrays is defined by said chips arranged in a pair of the two adjacent rows of said matrix, said first contacts in a corresponding pair of the two adjacent rows of said matrix, and said second contacts in a corresponding pair of the two adjacent rows of said matrix;

said first bridges being first oblique bridges each integrally joining a pair of two obliquely opposed first contacts, one in the one row and the other in the adjacent row of said first matrix to give said first discrete couples;

said inter-array bridge joining a pair of two vertically opposed first contacts, one in the row of the chip array and the other in the row of the adjacent chip array for electrical interconnection between the adjacent chip arrays;

said second bridges being second vertical bridges each integrally joining the two adjacent second contacts in each column of said matrix to give said second discrete couples; and said second beam comprising second horizontal beams and at least two second vertical beam, said second horizontal beam horizontally interconnecting said second discrete couples within a thickness of said second contacts so that said second discrete couples are aligned along the rows of said matrix, said second vertical beam vertically interconnecting one of said second horizontal beams of one said chip array to corresponding one of said second horizontal beams of the adjacent chip array within a thickness of said second contacts.

6. The method as set forth in claim 1, wherein said method utilizes a single first sheet in which at least two said first carries are integrally interconnected through a first joint, and a single second sheet in which at least two said second conductive plates are integrally interconnected through a second joint;

said first and second sheets bonding to said thermoelectric bars to create at least two said thermoelectric module interconnected by said first and second joints, said method further including a step of separating said at least two thermoelectric module from each other by cutting said first and second joints after cutting said second beams and said thermoelectric bars.

7. The method as set forth in claim 2, wherein said first beam has a thickness less than that of said first contact and has its one surface flush with the surface of said first contacts receiving said thermoelectric bars, and said first bridge having a thickness equal to that of said first contact and connecting said first contacts within the same plane.

8. The method as set forth in claim 2, further comprising bending said first conductive plate to form said first contacts.

9. The method as set forth in claim 1, wherein a plurality of said first conductive plates are connected by first webs to form a first tape for retaining thereon a plurality of said thermoelectric modules which are subsequently separated.

10. The method as set forth in claim 2, wherein a plurality of said first conductive plates are connected by first webs to form a first tape, and a plurality of said second conductive plates are connected by second webs to form a second tape, said thermoelectric bars being secured between the first and second conductive plates after which said first and second beams of each of said first and second conductive plates are cut out together with said thermoelectric bars to give a plurality of said thermoelectric modules connected by said first and second webs to each other followed by said first and second webs being cut for separating the individual thermoelectric modules from each other.

11. The method as set forth in claim 1, wherein said first carrier is cut along the same planes in which said second conductive plate is cut into said second discrete couples.

* * * * *